United States Patent [19]
Bacher

[11] 4,089,038
[45] May 9, 1978

[54] DIELECTRIC COMPOSITIONS OF ZIRCONATES AND/OR ALUMINATES AND DEVICES THEREOF

[75] Inventor: Rudolph John Bacher, New Castle, Del.

[73] Assignee: E. I. Du Pont de Nemours and Co., Wilmington, Del.

[21] Appl. No.: 672,032

[22] Filed: Mar. 30, 1976

[51] Int. Cl.$^2$ .................... C04B 35/00; H01G 4/20
[52] U.S. Cl. .................. 361/320; 106/39.6; 106/53; 106/73.4; 252/63.5
[58] Field of Search .............. 106/73.4, 53, 39.8; 317/258; 361/320, 321; 252/63.5

[56] References Cited

U.S. PATENT DOCUMENTS

| | | | |
|---|---|---|---|
| 3,267,342 | 8/1966 | Pratt et al. | 317/258 |
| 3,470,002 | 9/1969 | DiMarcello et al. | 106/53 X |
| 3,787,219 | 1/1974 | Amin | 106/39.8 |
| 3,819,990 | 6/1974 | Hayashi | 317/258 |
| 3,940,255 | 2/1976 | Harrington et al. | 106/39.8 |
| 3,950,174 | 4/1976 | Suzuki et al. | 106/53 |
| 3,996,502 | 12/1976 | Bratschun | 361/321 |

FOREIGN PATENT DOCUMENTS 2,460,931  9/1975  Germany ............... 252/63.5

OTHER PUBLICATIONS

Bacher, R. J. et al. - "Thick Film Temperature - Compensating Capacitor Dielectrics"- pub. by I.E.E.E, 24th Electronic Components Conf., Washington, pp. 87–93, May 1974.
Electronic and Newer Ceramics, pub. by Ind. Pub. Co. Chicago (1959) "Magnesium Zirconate" p. 184.

Primary Examiner—Helen M. McCarthy
Attorney, Agent, or Firm—James A. Forstner

[57] ABSTRACT

Dielectric powder compositions of certain alkaline earth metal zirconates and/or aluminates plus a glass, useful for forming dielectric layers in multilayer electrode/dielectric structures on an alumina substrate. Also, dispersions of such compositions in a vehicle and the resultant multilayer structures.

14 Claims, No Drawings

DIELECTRIC COMPOSITIONS OF ZIRCONATES AND/OR ALUMINATES AND DEVICES THEREOF

BACKGROUND OF THE INVENTION

This invention relates to printed circuits, and more particularly to compositions for producing dielectric layers for use in such circuits.

It is useful in fabricating printed circuits to be able to conserve space by disposing a metallization directly above other metallizations. To prevent shorting and reduce capacitance coupling, such metallizations must be separated by dielectric material.

There are two ways to produce such multilayer structures. The first consists of printing and firing "crossover" layers between printed conductor layers on a single substrate, to form what is sometimes called a "multilevel" printed wiring board. The second method involves printing conductor patterns on organic-bonded thin "tapes" of particulate alumina, then laminating such printed tapes and firing the resultant laminated structure at high temperature to make a discrete monolithic multilayer structure which serves as its own substrate. The present invention describes the role of certain compositions in forming, inter alia, crossover dielectric layers in the "multilevel" type of process, wherein the substrate is a prefired alumina ceramic.

A crossover dielectric composition is essentially a low dielectric constant insulator capable of separating two conductor patterns through several firing steps. High melting, viscous glasses have been used as the dielectric so that the firing of the top conductor line can be carried out at a temperature below that at which softening of the dielectric occurs. Melting or softening of the crossover dielectric is accompanied by shorting of the two conductor patterns against each other with subsequent failure of the electrical circuit. The major requirement for a crossover dielectric is control of resoftening or thermoplasticity in the top conductor firing step. Other property requirements are: (a) low dielectric constant to provide low A.C. capacitance coupling between the circuits insulated by the crossover dielectric, (b) low electric loss (high Q) to avoid dielectric heating, (c) low "pinholing" tendency and a low tendency to evolve gasses in firing, (d) proper glass softening temperature so that the initial firing is adaptable to the screen printing process, (e) a high resistance to thermal shock crazing, and (f) low sensitivity to water vapor and subsequent spurious electrical losses.

Also required are compositions for producing dielectric layers in multilayer capacitors printed on an alumina substrate. Such capacitors include those of Bacher et al. U.S. Pat. No. 3,683,245 and Bergmann U.S. Pat. No. 3,679,943, each of which is incorporated by reference herein.

Among the numerous compositions known for producing dielectric layers in multilayer structures are compositions based upon glasses, such as the crystallizable glasses of Hoffman U.S. Pat. No. 3,586,522 or Amin U.S. Pat. No. 3,785,837; or upon mixtures of crystalline materials and glasses such as Amin U.S. Pat. No. 3,787,219 and Bacher et al. U.s. Pat. No. 3,837,869. Each of these four patents is incorporated by reference herein.

Often the alumina substrate on which multilayer functions are formed is distorted or bowed by forces exerted by the fired dielectric layer(s). There is a need for dielectric compositions which have thermal expansion characteristics such that bowing is reduced, since otherwise substrate cracking and poor film adhesion can result. The fired dielectric layers must be nonporous, as defined herein, and fireable at temperatures compatible with typical electrode compositions (e.g., below 975° C.). Furthermore, when crystalline fillers are used, they should exhibit relatively low dielectric constants.

Reduction in alumina substrate bowing caused by many commercially available dielectric compositions is important, since distorted (non-planar) substrates makes alignment difficult in printing subsequent layers on the substrate. Also, bowed substrates are more difficult to mount into connector assemblies. Furthermore, the compressive forces exerted by the dielectric layer can result in cracking of the alumina substrate when it undergoes thermal cycling, for example in dip soldering of the electrodes.

There is a further need for dielectric compositions which can be fired in nitrogen. Nitrogen firing capability is required where the electrode is a reactive or base metal which cannot be fired in air without degradation (i.e. oxidation).

SUMMARY OF THE INVENTION

I have invented certain compositions useful for printing dielectric layers in multilayer electronic structures. The compositions have a reduced tendency to cause substrate distortion or bowing (i.e., deviation from planarity), and can be fired in air as well as in nitrogen. The compositions comprise, by weight complementally, (a) 65-90% of one or more glasses having a softening point greater than 700° C. and a thermal expansion coefficient less than that of alumina, and (b) 10-35% of one or more fillers which are
1. crystalline compounds (ternary oxides) of the formula $AB_2O_4$ wherein
   A is divalent Mg, Ca, Sr and/or Ba and B is trivalent Al,
2. crystalline compounds (ternary oxides) of the formula $ABO_3$ wherein
   A is divalent Mg, Ca, Sr and/or Ba and B is tetravalent Zr, and/or
3. mixtures of precursor crystalline oxides capable of forming crystalline compounds (1) and (2),
provided that where the sum of the weights of crystalline compounds (1) and (2) in these (unfired) compositions is less than 10%, the relative proportions of precursor crystalline oxides (3) are such that in the fired dielectric layer(s) in the aforesaid multilayer electronic structure(s) there will be a total of at least 10% of crystalline compounds (1) and (2).

The term "and/or" when used to refer to a series of items herein means each of those items individually and mixtures of those items.

The compositions preferably comprise 67.5-85% (a) and 15-32.5% (b). Preferably the compositions comprise only preformed ternary oxides (1) and (2) in component (b), and more preferably these oxides are Mg and Ca crystalline compounds, most preferably Mg compounds. When the compositions are to be fired in nitrogen, the glass is preferably free of titanium (ti-free), or substantially so.

The compositions may be dispersed in an inert liquid printing vehicle.

Also part of this invention are multilayer electronic structures such as capacitors and multilevel structures comprising as sequential layers on a substrate a bottom electrode on and adherent to said substrate, a dielectric layer over and adherent to at least part of said bottom electrode, and a top electrode over and adherent to at least part of said dielectric layer, wherein said dielectric layer comprises by weight complementally, a. 65–90% glass having a softening point greater than 700° C. and a thermal expansion coefficient less than that of alumina, and b. 10–35% of one or more fillers which are
 1. crystalline compounds (ternary oxides) of the formula $AB_2O_4$ wherein
   A is divalent Mg, Ca, Sr, and/or Ba and
   B is trivalent Al, and/or
 2. crystalline compounds (ternary oxides) of the formula $ABO_3$ wherein
   A is divalent Mg, Ca, Sr, and/or Ba and
   B is tetravalent Zr,
 provided that where there is less than 35% of ternary oxides (1) and (2) there may be present an amount of precursor crystalline oxides capable of forming compounds (1) and (2) such that the total weight of said crystalline compounds (1) and (2) plus the precursor crystalline oxides does not exceed 35% of the aforesaid compositions.

Such devices include multilayer capacitors described in the examples below and multilevel patterns on a substrate.

The dielectric layers made using the compositions of this invention minimize alumina substrate bowing during firing and further can produce good electrical properties (e.g., dielectric constant below 10 and a Q, a measure of loss of power in a resonant circuit, of about 400 or greater).

The thermal coefficient of expansion is a measure of how much a standard size bar of the relevant material elongates per degree centigrade, measured between 25° and 300° C.

DETAILED DESCRIPTION

The compositions of the present invention comprise powders of glass and certain crystalline oxide fillers. These powders are sufficiently finely divided to be used in conventional screen printing operations. Generally, the powders are sufficiently finely divided to pass through a 400-mesh screen, and preferably have an average particle size in the range 0.5–15 microns. To achieve these sizes, the powders may be ground in a mill (ball or multidiemnsional) prior to use.

The glass and crystalline oxides and their relative proportions are chosen such that they will cause reduced distortion (bowing) of the alumina substrate upon firing of the dielectric layer.

The glasses used are substantially nonconductive and have a softening point (the temperature at which the glass deforms rapidly) greater than 700° C. and have a thermal expansion coefficient less than that of alumina ($70 \times 10^{-7}/°$ C.). Generally, glasses with less than a total of 30% $Bi_2O_3$ plus PbO are preferred.

The glasses in the present invention are prepared from suitable batch compositions of oxides (or oxide precursors such as hydroxides and carbonates) by melting any suitable batch composition which yields the desired compounds in the desired proportions. The batch composition is first mixed and then melting to yield a substantially homogeneous fluid glass. The temperature maintained during this melting step is not critical, but is usually within the range 1450°–1550° C. so that the rapid homogenation of the melt can be obtained. After a homogeneous fluid glass is obtained, it is normally poured into water to form a glass frit.

The crystalline ternary oxides set forth above have a thermal coefficient of expansion greater than that of alumina. The oxides include $MgAl_2O_4$, $CaAl_2O_4$, $SrAl_2O_4$, $BaAl_2O_4$, $MgZrO_3$, $CaZrO_3$, $SrZrO_3$, $BaZrO_3$ and mixtures thereof, including physical mixtures and mixed crystalline compounds such as $Ca_{0.5}Sr_{0.5}ZrO_3$. The crystalline oxides, sometimes referred to as ternary oxides herein, may be present in the (unfired) powder compositions of this invention. Alternately they may be formed upon firing of the dielectric composition in the multilayer configuration. Thus, the powder compositions may contain some or no ternary oxide, but if less than 10% ternary oxide is present in the powder compositions there will be sufficient precursor crystalline oxides present (e.g., MgO and $Al_2O_3$ for $MgAl_2O_4$) that in the fired dielectric there will be at least 10% ternary oxide. Thus, if 5% $MgAl_2O_4$ were present in the powder composition, there would be sufficient precursor oxides in the powder to form at least 5% more of this or another ternary oxide in the fired dielectric layer.

The powder comprises 10–35% crystalline oxides, ternary oxides and/or precursor oxides thereof. Less than 10% ternary oxide does not provide adequate reduction in substrate bowing. More than 35% crystalline oxides results in porous dielectric layers. Porosity can cause sinking of the conductor layer into and through the dielectric, and hence shorting.

When precursor oxides remain in the fired dielectric layer, the total weight of the ternary and precursor oxides does not exceed 35%, but at least 10% ternary oxides are present. Thus the powder compositions comprise, by weight complementally, 10–35% crystalline oxides and 90–65% glass, preferably 15–32.5% oxides and 85–67.5% glass.

The compositions of this invention are printed as a film in the conventional manner onto alumina substrates bearing a prefired metallization. Preferably, screen or stencil printing techniques are employed. The composition is printed as a finely divided powder in the form of a dispersion in an inert liquid vehicle. Any inert liquid may be used as the vehicle, including water or any one of various organic liquids, with or without thickening and/or stabilizing agents and/or other common additives. Exemplary of the organic liquids which can be used are the aliphatic alcohols; esters of such alcohols, for example, the acetate and proprionates; terpenes such as pine oil, terpineol and the like; solutions of polyisobutyl methacrylate in 2,2,4-trimethyl pentanediol-1,3-monoisobutyrate; solutions of resins such as the polymethacrylates of lower alcohols, or solutions of ethyl cellulose, in solvents such as pine oil and the monobutyl ether of ethylene glycol monoacetate. The vehicle may contain or be composed of volatile liquids to promote fast setting after application to the substrate.

The ratio of vehicle to inorganic solids may vary considerably and depends upon the manner in which the dispersion is to be applied and the kind of vehicle used. Generally, from 0.4 to 9 parts by weight of solids per part by weight of vehicle will be used to produce a dispersion of the desired consistency. Preferably, 2–4 parts of inorganic solids per part of vehicle will be used.

After the compositions of the present invention are printed onto prefired ceramic substrates (with metallizations thereon), the substrate is refired. Generally, the dielctric composition is fired in the temperature range 800°-975° C. to form a continuous dielectric layer. Preferably, the firing is conducted at a peak temperature of about 900°-950° C. Peak temperature is held for about 10 min. normally, although 5-30 min. may be used by one skilled in the art. Belt or box furnaces may be used. Where a belt furnace is used the total firing cycle is normally about 40-60 min.

These compositions may be fired in air or in nitrogen. When nitrogen firing is intended, it is preferred that the glass be Ti-free or substantially Ti-free.

Although the compositions of this invention are designed to be used as dielectric layers in multilayer structures formed on alumina substrates, these compositions may be used with other substrates, including substrates having thermal expansion characteristics similar to those of alumina. Typical commercially available densified (prefired) alumina substrates comprise above 90% alumina; for example, American Lava Corp. Alsimag 614 contains 96% alumina.

The multilayer structures of this invention include conductive layers (e.g., capacitors) or lines (e.g., complex circuits with dielectric pads or "crossovers" at the point of crossover of the conductor lines). The geometry of the multilayer structure is not of the present invention, but will be designed in the conventional manner by those skilled in the art, according to their requirements. Amin U.S. Pat. No. 3,785,837, discusses crossover dielectrics and Amin U.S. Pat. No. 3,787,219 discloses multilayer capacitors. Structures with a few, or a multiplicity, of layers can be provided with the compositions of this invention.

EXAMPLES

In the following examples presented to illustrate the invention, all parts percentages, ratios, etc. are by weight, unless otherwise stated. In a number of examples multilayer capacitors of two conductors and an intermediate dielectric layer were printed and fired on an alumina substrate to demonstrate the utility of the present invention. In other examples the dielectric composition was printed on an alumina substrate and fired to illustrate an advantage of the present invention, reduced substrate deformation or bowing due to the fired dielectric layer. In every example the substrate was a prefired (densified) 96% alumina substrate, American Lava Corp. Alsimag 614.

The glasses used in these examples were prepared as follows. A physica mixture, in the desired proportions, of metal oxides, hydroxides and/or carbonates was prepared and melted at a peak temperature of 1450°-1550° C., and then quenched by pouring into water. The glasses were then finely ground in a conventional 1-liter ball mill with 26 ¼-inch alumina balls (36 g. glass, 15 ml. water, milled 2 hr.), filtered and dried. The powder was wet screened through a 400-mesh sieve. Average particle size was 1-5 microns, with all particles between about 1 and 20 microns.

The crystalline oxides, i.e., precursor oxides or ternary oxides (1) and (2), i.e., the rare earth zirconates and aluminates, were either commercially available or prepared using conventional techniques. For exaMPLE, $MgAl_2O_4$ was prepared by mixing one mole of MgO and one mole of $Al_2O_3$ (total solids charge 100 g.) and 50 g. water for 0.5 hr. in a 1-liter ball mill, as described above. The product was filtered, then dried at 125° C. and finally heated in air in an alumina boat for 2 hr. The product was then crushed, remilled (as before) and reheated at 1300° C. for 2 hr. Final milling was accomplished by milling 100 g. of the remilled product and 100 ml. water in a multidimensional mill for 2 hr. (purchased crystalline oxides were also subjected to this final milling step). The particle size of the resultant oxide was in the range of about 1-20 microns, average particle size 1-5 microns.

Dispersions of glass and crystalline oxides were prepared by mixing the desired relative amounts of finely divided glass and crystalline oxides (usually in a Hoover muller) with a vehicle of suitable consistency and rheology for screen printing. The solids/vehicle ratio was 77/23, that is, 77 parts inorganic solids (glass and crystalline oxides) were mixed with a vehicle of 22.8 parts of a mixture of polymer and solvent (20% polyisobutyl methacrylate in 80% of a solvent which was 2,2,4-trimethyl pentanediol-1,3-monoisobutyrate) and 0.2 parts of a wetting agent (soya lecithin). In some instances up to 2 additional parts of that solvent was added to modify rheology.

EXAMPLES 1-9; COMPARATIVE SHOWINGS A-E

In these experiments the dielectric composition of the present invention was printed and fired in air on alumina substrates to demonstrate the reduction in substrate distortion (bowing) with the compositions of the present invention. The substrate was 2 in. (5.08 cm.) by 1 in. (2.54 cm.) by 25 mils (0.64 mm.) thick. A 200-mesh printing screen was masked at the center (a ¼-inch or 0.64 cm. square) so that the one entire surface of the substrate would be covered with dielectric composition, except for that central square. First the thickness (height) of that central square was measured on each substrate with a Starrett gauge. Percent bowing equals change in height at the center of the substrate divided by the thickness of the substrate, each in mils. The glass had a thermal expansion coefficient of $50 \times 10^{-7}/°$ C. The glass contained 40% $SiO_2$, 18% BaO, 5% CaO, 6% $B_2O_3$, 10% $al_2O_3$, 5% MgO, 8% ZnO, and 8% PbO. A layer of the dielectric composition set forth in Table 1 was then printed through that patterned 200-mesh screen on the substrate. The print was dried at 120° C. for 10 min. and then a second dielectric print was printed over the first and dried as before. The printed substrate was fired in a box furnace at 950° C. for 10 min.

Two additional dielectric layers were printed and dried as before; firing was repeated as before. Height at the center of the alumina substrate was then measured. The percentage distortion or bowing at the center of the substrate indicated in Table 1 compares the change in height before any printing or firing as described herein and after these steps. The percent bowing in Examples 1-9 is seen to be improved over that in Showings A-D using the binary oxides $Al_2O_3$, $ZrO_2$ and MgO, or showing E using the same glass as Showings A-D and Examples 1-9, but no crystalline filler.

The dielectric layers were found to have an excellent appearance (except for Showing D which exhibited cracking and a rough surface, and hence was unacceptable) and to be non-porous by an ink test, as follows. A drop of water soluble ink (Sheaffers Skrip deluxe blue No. 2) was placed on the fired dielectric and allowed to stand for about a minute, then washed under running water for about 5 sec. If a stain emains the sample is considered porous.

TABLE 1
SUBSTRATE BOWING EXPERIMENTS

| Example (No.) or Comp. Showing (Letter) | Crystalline Fillers (and molar ratio) | Filler to Glass Wt. Ratio | Wt. % Preformed Ternary Oxide among Inorganic Powders in Composition | % Bowing |
|---|---|---|---|---|
| 1 | $MgAl_2O_4$ | 26/74 | 26 | +6.2% |
| 2 | 1 MgO | 26/74 | 0 | +7.4% |
| 3 | 1 $Al_2O_3$ / 1 $MgAl_2O_4$ | 26/74 | 20 | +1.0% |
| 4 | 1 MgO / 1 MgO | 26/74 | 0 | +0.5% |
| 5 | 1 $ZrO_2$ / 2 MgO | 26/74 | 0 | +6.5% |
| 6 | 1 $ZrO_2$ / 2 MgO | 32.5/67.5 | 0 | +1.0% |
| 7 | 1 $ZrO_2$ / $CaZrO_3$ | 26/74 | 26 | +0.5% |
| 8 | $SrZrO_3$ | 26/74 | 26 | +2.8% |
| 9 | $BaZrO_3$ | 26/74 | 26 | +10.4% |
| A | $Al_2O_3$ | 25/75 | 0* | +22.4% |
| B | $Al_2O_3$ | 32.5/67.5 | 0* | +24.0% |
| C | $ZrO_2$ | 26/74 | 0* | +15.2% |
| D | MgO | 26/74 | 0* | *** |
| E | None | 0/100** | 0 | +24.4 |

*Only one crystalline binary oxide in powder composition.
**No crystalline oxides present in powder composition.
***Significant amount of negative bowing; dielectric layer cracked.

COMPARATIVE SHOWINGS F-I

The substrate bowing experiment of Example 1 was repeated using an amount of crystalline filler greater than that of the present invention, with the result that the dielectric layers were porous by the ink test described above. In these showings the inorganic powders contained 40% crystalline filler and 60% glass. The glass was that of Example 1, the inorganic solids/vehicle ratio was 77/23 as in Example 1, the same vehicle and printing and firing procedure were used, except that the firing temperature was 900° C. The crystalline fillers (with percentage performed ternary oxide among inorganic powder in parentheses) were:

F: 2 MgO/1 $ZrO_2$, (0)
G: $MgAl_2O_4$, (40)
H: 1 $MgAl_2O_4$/1 MgO, (31)
I: $CaZrO_3$ (40)

Each fired dielectric was porous according to the above described ink test, illustrating that less than 40% crystalline filler must be used in this invention.

EXAMPLES 10-12; Showing J

The substrate bowing test of Example 1 was repeated, except that a different glass was used: 54.5% $SiO_2$, 14.5% $Al_2O_3$, 22.0% CaO, 8.5% $B_2O_3$, 0.5% NaO; TCE, 60 × $10^{-7}$/° C. Composition and results are shown in Table 2. The firing was in air at 950° C., as in Example 1. None of the fired dielectrics were porous by the ink test; each had an excellent appearance. The compositions of the present invention exhibited only 0.5-1.5% bowing, versus 10.4% for a composition with an alumina filler (at the same relative percentage).

EXAMPLES 13-23; SHOWINGS K-L

In these examples multilayer capacitors were prepared using the dielectric compositions of this invention. Table 3 sets forth the identity and relative proportions of the inorganic solids, from which dispersions were formed as before. The substrate dimensions were 1 inch (2.54 cm.) by 1 inch (2.54 cm.) by 25 mils (0.64 mm.) thick.

A bottom electrode (400 mil circle with electrode tabs extending therefrom, i.e., a "keyhole" pattern) was printed on the substrate with a gold composition through a 325-mesh screen, dried at 125° C. for 10 min., and fired in air at 900° C. for 10 min. The gold composition contained 80.3 parts finely gold and 3.7 parts finely divided glass binder dispersed in 16 parts vehicle (7.6% ethyl cellulose/93.4% terpineol). The fired electrode thickness was about 0.7 mil.

A dielectric layer (a 440-mil circle) was printed over the fired bottom electrode, overlapping the bottom electrode in the circular area where the top electrode (a keyhole pattern) was intended to be printed. The dielectric layer was dried at 125° C. for 10 min. and then a second dielectric layer was printed on the first and dried. The structure was refired at 900° C. for 10 min. The thickness of the dielectric laye is set in Table 3.

A top electrode (keyhole pattern) was printed and dried as before over the fired dielectric layer using the same gold composition, and then fired at 900° C. for 10 min.

Q, a measure of loss of power in a resonant circuit (the higher the Q, the lower the power loss), was determined by reading capacitance (pF) and conductance

TABLE 2
SUBSTRATE BOWING EXPERIMENTS

| Example (No.) or Showing (Letter) | Crystalline Fillers (and molar ratios) | Filler to Glass Wt. Ratio | Wt. % Preformed Ternary Oxide among Inorganic Powders in Composition | % Bowing |
|---|---|---|---|---|
| 10 | $CaZrO_3$ | 26/74 | 26 | +0.5% |
| 11 | $MgAl_2O_4$ | 26/74 | 26 | +1.5% |
| 12 | 2 MgO | 26/74 | 0 | +0.5% |
| J | 1 $ZrO_2$ / $Al_2O_3$ | 26/74 | 0 | +10.4% |

(mho) from a General Radio 1682 (1 MHz) bridge and then using the following equation $$Q = 2\pi \frac{\text{Capacitance}}{\text{Conductance}}$$

Dissipation factor in decimals was determined using a General Radio 1672A (1 kHz) bridge, and was then converted into percentage.

Dielectric constant was determined from the capacitance, as follows:

$$K = \frac{C \times t \times 10^6}{0.224 \times A}$$

where C is capacitance (pF) t and A are thickness and area of the dielectric, respectively, in mils.

IR was determined at 100 volts D. C. using a Penn Airborne Products Co. Megatrometer Model 710.

Breakdown voltage (volts A.C.) was determined using an Associated Research Inc. Hypot Breakdown tester.

As indicated in Table 3, good electrical properties were obtained with each composition. The IR for each multilayer capacitor was about $10^{13}$ ohms.

Example 13 and the glass of Example 1 were used, except as indicated. The electrode material comprises a base metal, copper (80.6 parts finely divided copper and 6.2 parts finely divided glass) dispersed in 13.2 parts vehicle (2.5 parts ethyl cellulose, 48.5 parts dibutyl phthalate, 46.6 parts terpineol and 2.4 parts soya lecithin).

Firing was conducted in flowing nitrogen in a belt furnace rather than in a box furnace. The firing schedule was 55 min., with 10 min. at a peak temperature at 900° C. Materials and capacitor properties are set forth in Table 4.

TABLE 4

| | | | CAPACITOR FORMATION-FIRED IN N$_2$ | | | | |
|---|---|---|---|---|---|---|---|
| Example No. | Crystalline Fillers (and molar ratio) | Filler to Glass Wt. Ratio | Wt. % Preformed Ternary Oxide among Inorganic Powders in Composition | Diel. Constant at 1 kHz | Diss. Factor at 1 kHz (%) | Q at 1 MHz | Diel. Thickness (mils) |
| 24 | MgAl$_2$O$_4$ | 26/74 | 26 | 5.2 | 0 | 1318 | 2.2 |
| 25 | 2 MgO 1 ZrO$_2$ | 26/74 | 0 | 6.4 | 0 | 1100 | 2.0 |
| 26 | BaZrO$_3$ | 26/74 | 26 | — | — | >1000 | N.D.* |
| 27 | SrZrO$_3$ | 26/74 | 26 | — | — | >1000 | N.D. |
| 28 | CaZrO$_3$ | 26/74 | 26 | — | — | >1000 | N.D. |
| 29 | 1 MgO 2 Al$_2$O$_3$ | 26/74 | 0 | 5.5 | 0.8 | 775 | 2.2 |

*N.D. means not determined.

I claim:

1. Compositions of finely divided inorganic powders useful for forming dielectric layers in multilayer electronic structures of conductive and dielectric layers on an alumina substrate; those dielectric layers being capable of producing such multilayer structures having a dielectric constant below 10 and a dissipation factor of 0.8% or less, each at 1 kHz., and a quality factor of about 400 or greater at 1 MHz., the compositions consisting essentially of, by weight, a. 67.5–85% of one or more non-conducting glasses having a softening point greater than 700° C. and a thermal expansion coefficient less than that of alumina, and the balance is b. 15–32.5% of one or more of

TABLE 3

| | | | | CAPACITOR FORMATION - FIRED IN AIR | | | | | |
|---|---|---|---|---|---|---|---|---|---|
| Example (No.) or Showing (Letter) | Crystalline Fillers (and molar ratio) | Glass* Used | Filler to Glass Wt. Ratio | Wt. % Preformed Ternary Oxide among Inorganic Powders in Composition | Diel. Constant at 1 kHz | Diss. Factor at 1 kHz (%) | Q at 1 MHz | Diel. Thickness (Mils) | Breakdown Voltage (Volts AC) |
| 13 | 2 MgO 1 ZrO$_2$ | 10 | 26/74 | 0 | 6.2 | 0.17 | 473 | 1.5 | 1333 |
| 14 | CaZrO$_3$ | 10 | 26/74 | 26 | 7.0 | 0.18 | 393 | 1.3 | 530 |
| K | Al$_2$O$_3$ | 10 | 26/74 | 0** | 8.4 | 0.11 | 463 | 2.0 | 500 |
| 15 | MgAl$_2$O$_4$ | 10 | 26/74 | 26 | 7.6 | 0.15 | 438 | 1.8 | 867 |
| 16 | 1 MgO 1 ZrO$_2$ | 1 | 26/74 | 0 | 7.1 | 0.01 | 1683 | 2.3 | 687 |
| 17 | MgAl$_2$O$_4$ | 1 | 26/74 | 26 | 8.0 | 0.05 | 835 | 1.5 | 1233 |
| 18 | BaZrO$_3$ | 1 | 26/74 | 26 | 9.1 | 0.05 | 618 | 2.2 | 2000 |
| 19 | SrZrO$_3$ | 1 | 26/74 | 26 | 8.0 | 0.05 | 713 | 1.7 | 667 |
| 20 | CaZrO$_3$ | 1 | 26/74 | 26 | 7.9 | 0.11 | 662 | 1.5 | 767 |
| L | NONE | 1 | 0/100 | 0*** | 6.3 | 0.04 | 790 | 2.0 | >2000 |
| 21 | 2 MgO 1 ZrO$_2$ | 1 | 30/70 | 0 | 6.8 | 0.0 | 765 | 2.3 | 800 |
| 22 | 1 MgAl$_2$O$_4$ | 1 | 26/74 | 20 | 6.5 | 0.0 | 655 | 2.0 | 1100 |
| 23 | 1 MgO 2 MgO 1 ZrO$_2$ | 1 | 32/68 | 0 | 7.5 | 0.0 | 831 | 2.4 | 1200 |

*Glass 1 is the glass of Example 1; Glass 10 is the glass of Example 10.
**Only one crystalline binary oxide in powder composition.
***No crystalline oxides present in powder composition.

EXAMPLES 24–29

These examples illustrate the use of compositions of the present invention to produce multilayer structures by firing in nitrogen rather than air. The procedure of 1. crystalline ternary oxides of the formula $AB_2O_4$ wherein
   A is divalent Mg, Ca, Sr and/or Ba and
   B is trivalent Al,
2. crystalline ternary oxides of the formula $ABO_3$ wherein
   A is divalent Mg, Ca, Sr and/or Ba and
   B is tetravalent Zr,
3. mixtures of precursor crystalline oxides capable of forming crystalline ternary oxides (1) and (2), provided that where the sum of the weights of crystalline ternary oxides (1) and (2) in these compositions is less than 15%, the relative proportions of precursor crystalline oxides (3) are such that in the fired dielectric layers(s) in the aforesaid multilayer electronic structure(s) there will be a total of at least 15% of crystalline ternary oxides (1) and (2).

2. Compositions according to claim 1 wherein component (b) is 15–32.5% of crystalline ternary oxides (1) and (2) or mixtures thereof.

3. Compositions according to claim 1 wherein component (a) is Ti-free.

4. Compositions according to claim 2 wherein component (a) is Ti-free.

5. Compositions according to claim 1 wherein component (b) consists of 15–32.5% of crystalline ternary oxides (1) and (2) wherein A is Mg, Ca, or mixtures thereof.

6. Compositions according to claim 5 wherein A is Mg.

7. Compositions according to claim 6 wherein (b) is $MgAl_2O_4$.

8. Compositions according to claim 6 wherein (b) is $MgZrO_3$.

9. Compositions according to claim 1 dispersed in an inert liquid vehicle.

10. Compositions according to claim 2 dispersed in an inert liquid vehicle.

11. Compositions according to claim 5 dispersed in an inert liquid vehicle.

12. In multilayer electronic structures comprising as sequential layers on a prefired alumina substrate a bottom electrode on and adherent to said substrate, a dielectric layer over and adherent to at least part of said bottom electrode, and a top electrode over and adherent to at least part of said dielectric layer, improved multilayer structures capable of having a dielectric constant below 10 and a dissipation factor of 0.8% or less, each at 1 kHz., and a quality factor of about 400 or greater at 1 MHz., wherein said dielectric layer(s) consist essentially of by weight,
   a. 67.5–85% non-conducting glass having a softening point greater than 700° C. and a thermal expansion coefficient less than that of alumina, and the balance is
   b. 15–32.5% of one or more of
      1. crystalline ternary oxides of the formula $AB_2O_4$ wherein
         A is divalent Mg, Ca, Sr, and/or Ba and
         B is trivalent Al,
      2. crystalline ternary oxides of the formula $ABO_3$ wherein
         A is divalent Mg, Ca, Sr, and/or Ba and
         B is tetravalent Zr,
      provided that where there is less than 32.5% of crystalline ternary oxides (1) and (2) there may be present an amount of precursor crystalline oxides capable of forming compounds (1) and (2) such that the total weight of said crystalline ternary oxides (1) and (2) plus the precursor crystalline oxides does not exceed 32.5% of the aforesaid compositions.

13. Structures according to claim 12 wherein component (b) is 15–32.5 % crystalline ternary oxides (1)and (2) or mixtures thereof.

14. Structures according to claim 13 wherein component (b) is crystalline ternary oxides (1) and (2) wherein A is Mg, Ca and mixtures thereof.

* * * * *

UNITED STATES PATENT OFFICE
CERTIFICATE OF CORRECTION

PATENT NO. : 4,089,038
DATED : May 9, 1978
INVENTOR(S) : RUDOLPH JOHN BACHER

It is certified that error appears in the above-identified patent and that said Letters Patent are hereby corrected as shown below:

Col. 11, line 19 and Col. 12, line 34, before the period insert ---, and wherein the crystalline ternary oxides have a thermal expansion coefficient greater than that of alumina---.

Signed and Sealed this

Sixth Day of February 1979

[SEAL]

Attest:

RUTH C. MASON
Attesting Officer

DONALD W. BANNER
Commissioner of Patents and Trademarks